US010634252B2

(12) United States Patent
Aromin et al.

(10) Patent No.: US 10,634,252 B2
(45) Date of Patent: *Apr. 28, 2020

(54) DUAL GASKET RETAINERS FOR MATING ELECTRICAL DEVICE ENCLOSURES

(71) Applicant: Tower Manufacturing Corporation, Providence, RI (US)

(72) Inventors: Victor V Aromin, West Warwick, RI (US); Daniel R Paquette, Woonsocket, RI (US); Louis Jay Shatkin, Warwick, RI (US)

(73) Assignee: Tower Manufacturing Company, Providence, RI (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/535,583

(22) Filed: Aug. 8, 2019

(65) Prior Publication Data

US 2019/0360591 A1 Nov. 28, 2019

Related U.S. Application Data

(63) Continuation-in-part of application No. 16/147,924, filed on Oct. 1, 2018, now Pat. No. 10,539,236, which (Continued)

(51) Int. Cl.
| *F16J 15/04* | (2006.01) |
| *F16J 15/10* | (2006.01) |
| *H05K 5/00* | (2006.01) |
| *F16J 15/06* | (2006.01) |
| *H05K 5/02* | (2006.01) |
| *H05K 5/03* | (2006.01) |

(52) U.S. Cl.
CPC ............. *F16J 15/10* (2013.01); *F16J 15/062* (2013.01); *H05K 5/0004* (2013.01); *H05K 5/0247* (2013.01); *H05K 5/03* (2013.01)

(58) Field of Classification Search
CPC .. F16J 15/00; F16J 15/12; F16J 15/14; H05K 5/061; H01H 83/14
See application file for complete search history.

(56) References Cited

U.S. PATENT DOCUMENTS

| 4,112,283 A | * | 9/1978 | Lathrop | .................... F02P 7/04 116/200 |
| 4,298,204 A | * | 11/1981 | Jinkins | ................... F16J 15/062 220/378 |

(Continued)

*Primary Examiner* — Gilbert Y Lee (57) ABSTRACT

Dual sealing assemblies for mating and isolating a wire chamber from an electronics chamber within an electrical device enclosure is disclosed. The dual sealing assemblies include a dual chamber housing, wherein the dual chamber housing includes an electronics chamber and a wire chamber, and wherein the dual chamber housing isolates the electronics chamber from the wire chamber. The electrical device enclosure includes an electronics chamber cover mateable with the dual chamber housing for enclosing the electronics chamber; and, a wire chamber cover mateable with the dual chamber housing for enclosing the wire chamber. The wire chamber includes a compressible stubbed gasket having at least one locating stub corresponding to a receptacle in the dual chamber housing for positioning and holding the gasket within the top section during assembly.

16 Claims, 6 Drawing Sheets

Related U.S. Application Data is a continuation of application No. 15/459,487, filed on Mar. 15, 2017, now Pat. No. 10,132,410.

(56) References Cited

U.S. PATENT DOCUMENTS

| | | | | |
|---|---|---|---|---|
| 5,957,464 | A * | 9/1999 | Elliott | F16J 15/062 277/608 |
| 8,531,834 | B2 * | 9/2013 | Rayner | H01H 13/06 361/679.56 |
| 9,248,944 | B2 * | 2/2016 | Miyagawa | F16J 15/024 |
| 2013/0292383 | A1 * | 11/2013 | Mullaney | B65D 53/06 220/378 |

* cited by examiner

DUAL GASKET RETAINERS FOR MATING ELECTRICAL DEVICE ENCLOSURES

CROSS-REFERENCE TO RELATED APPLICATIONS

The present application is related to, claims the earliest available effective filing date(s) from (e.g., claims earliest available priority dates for other than provisional patent applications; claims benefits under 35 USC § 119(e) for provisional patent applications), and incorporates by reference in its entirety all subject matter of the following listed application(s) (the "Related Applications") to the extent such subject matter is not inconsistent herewith; the present application also claims the earliest available effective filing date(s) from, and also incorporates by reference in its entirety all subject matter of any and all parent, grandparent, great-grandparent, etc. applications of the Related Application(s) to the extent such subject matter is not inconsistent herewith:

U.S. patent application Ser. No. 16/147,924, entitled "Sealing Assembly for Mating an Electrical Device Enclosure", naming Victor V. Aromin as first inventor, filed 1 Oct. 2018 which is a continuation in part of U.S. patent application Ser. No. 15/459,487, now U.S. patent Ser. No. 10/132,410, entitled "Sealing Assembly for Mating an Electrical Device Enclosure", naming Victor V. Aromin as first inventor, filed 15 Mar. 2017.

FIELD OF THE INVENTION

This invention relates to waterproof sealing of enclosures for electrical devices. The present invention relates to dual gaskets with integral stub retainers. More particularly, the present invention relates to a removable wire cover while maintaining a water tight electronics chamber.

BACKGROUND

Electrical equipment such as transformers, relays, GFCIs, etc. which may be used outdoors, or may be used in an environment that has a risk of water contact, must be protected. This is not only to prevent the electrical equipment from electrically shorting, for example when it rains, but also to increase their useful life which would otherwise by shortened by constant exposure to the elements, ultraviolet and solar radiation, and so forth. Accordingly, there have long been protective enclosures in which this type of equipment has been housed. And, the enclosures must be accessed for service, repair, or replacement of the equipment.

It is well known that when connecting housing components of electronic or electrical devices together, gaskets must be used to ensure a secure and tight seal, to form a proper watertight connection. Furthermore, gaskets have a tendency to twist or dislocate during assembly of the electrical housing thereby preventing a watertight seal. Therefore, there is a need for a locating and holding means to retain the shape of gaskets and to aid in keeping them flush against connector bodies during compression.

Known devices for keeping gaskets in position during compression, such as in the coupling of conduits, or the like, usually include some type of compression fitting that forces the gasket inwardly as the conduits are being secured together. Such compression fittings usually include threaded portions and/or tapered portions on the inside of the conduits that force or urge the gasket against an inside diameter or wall when the conduits are screwed or otherwise secured together.

The known compression fittings are useful in many situations; however, they do not act to properly hold round or semi-circular gaskets in a position flush against a connector body when securing components together in electrical devices, wherein the sealing effectiveness may be compromised if the gaskets bow or are otherwise pushed outwardly, away from the connector body.

Known compression fittings use compressive forces that can over-stress or wear-out gaskets. Therefore, there exists a need in the art for a holding or retaining device that is easy to use and which more accurately and securely holds or retains in place a sealing gasket used when sealing components of electrical devices, without unduly stressing or compressing such gaskets.

Furthermore, access to a device is often required to connect the device, e.g., a GFCI, to a power cord. With a single gasket device there is an increased chance that while removing the wire cover to attach the power cord the single gasket sealing effectiveness may be compromised allowing seepage and/or moisture into the electronics chamber. Therefore, there exists a need in the art for a user to access the wire chamber without disturbing the factory set gasket protecting the electronics chamber.

SUMMARY OF THE INVENTION

The foregoing and other problems are overcome, and other advantages are realized, in accordance with the presently preferred embodiments of these teachings.

In accordance with one embodiment of the present invention a dual sealing gasket assembly for mating, enclosing, and isolating a wire chamber from an electronics chamber within an electrical device enclosure is provided. The electrical device enclosure includes a dual chamber housing, wherein the dual chamber housing includes an electronics chamber and a wire chamber, and wherein the dual chamber housing vertically and horizontally isolates the electronics chamber from wire chamber. An electronics chamber cover mateable with the dual chamber housing for enclosing the electronics chamber and a wire chamber cover mateable with the dual chamber housing for enclosing the wire chamber is provided. Also provided is a first sealing gasket and a stubbed gasket. The dual chamber housing comprises at least one receptacle for receiving the at least one locating stub.

BRIEF DESCRIPTION OF THE DRAWINGS

The foregoing and other objects, features, and advantages of the invention are apparent from the following detailed description taken in conjunction with the accompanying drawings in which.

DETAILED DESCRIPTION

Figure 1:
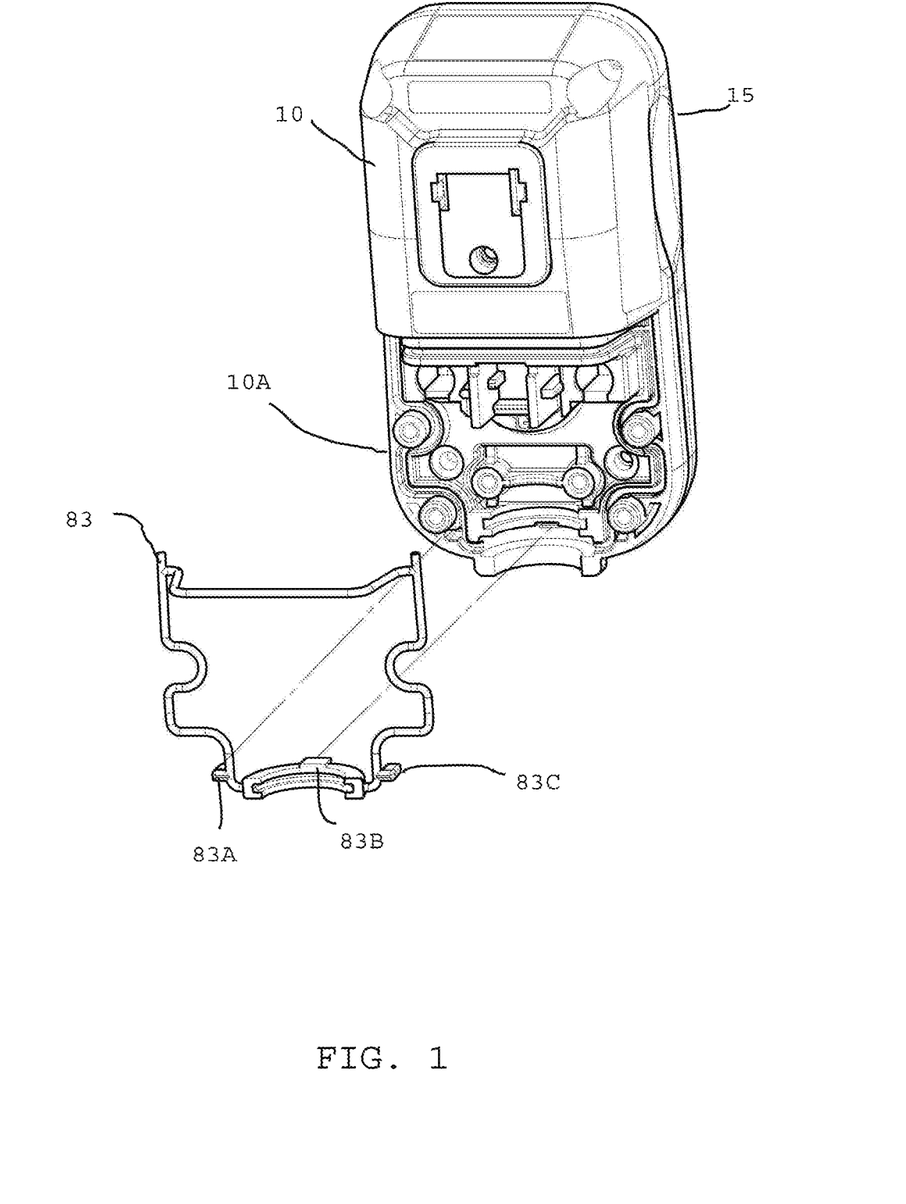
FIG. 1 is a perspective view of a dual stubbed wire chamber sealing gasket and electronics chamber gasket arrangement for a GFCI enclosure, partially assembled.

Referring to FIG. 1, is illustrated a sealing assembly implemented in an enclosure for a Ground Fault Circuit Interrupter (GFCI). However, the sealing assembly of the present invention can be applied to any structure suitable for housing an electrical device, or structure for sealing against moisture and the elements. Although, in the preferred embodiment illustrated herein, the sealing assembly, or arrangement is illustrated as implemented along the periphery of the enclosure sections, the assembly may be implemented in any arrangement/position to facilitate the mating of two sections.

Figure 2:
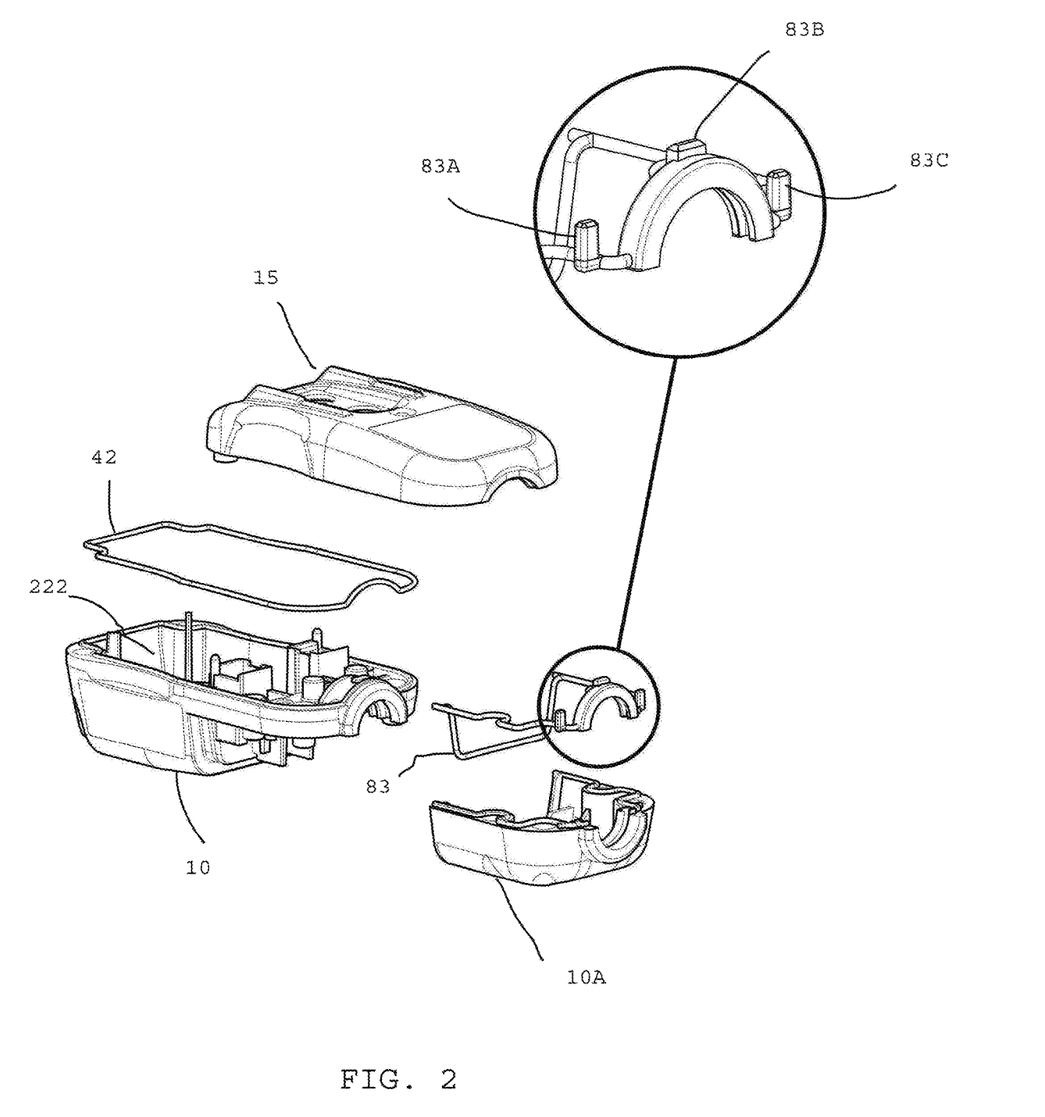
FIG. 2 is a perspective view of a dual stubbed wire chamber sealing gasket and electronics chamber gasket arrangement for the GFCI enclosure shown in FIG. 1, partially disassembled.

Referring to FIGS. 1 and 2 there are shown a perspective view of a dual stubbed sealing gasket arrangement for a GFCI enclosure partially disassembled; and a perspective view of the dual stubbed sealing gasket arrangement for a GFCI enclosure partially assembled. Shown in FIG. 1 is stubbed gasket 83 with locating stubs 83A, 83B, and 83C. FIG. 2 shows corresponding stub receiver slots 93A, 93B, and 93C. It will be appreciated that gasket stubs 83A, 83B, and 83C fitted into corresponding stub receiver slots 93A, 93B, and 93C help to properly locate and hold gasket 83 during mating assembly of wire chamber cover 10A onto dual-chamber housing 10.

Still referring to FIG. 1 and FIG. 2, it will be appreciated that factory assembled cover 10 and cover 15 need not be disassembled for a user to connect a power cord (not shown) and thus increasing the chance for damaging the GFCI circuitry housed in the electronics chamber 222.

Sealing assembly 12 is integrated in the periphery of both the top cover 15 and dual-chamber housing 10 and the wire chamber cover 10A and the dual-chamber housing 10 of the GFCI enclosure 401 of FIG. 2. Referring to FIGS. 1, 2, 3, and 4, the sealing mechanism 12 in this example is for mating the top 15 and dual-chamber 10 covers of an electrical enclosure.

Figure 3:
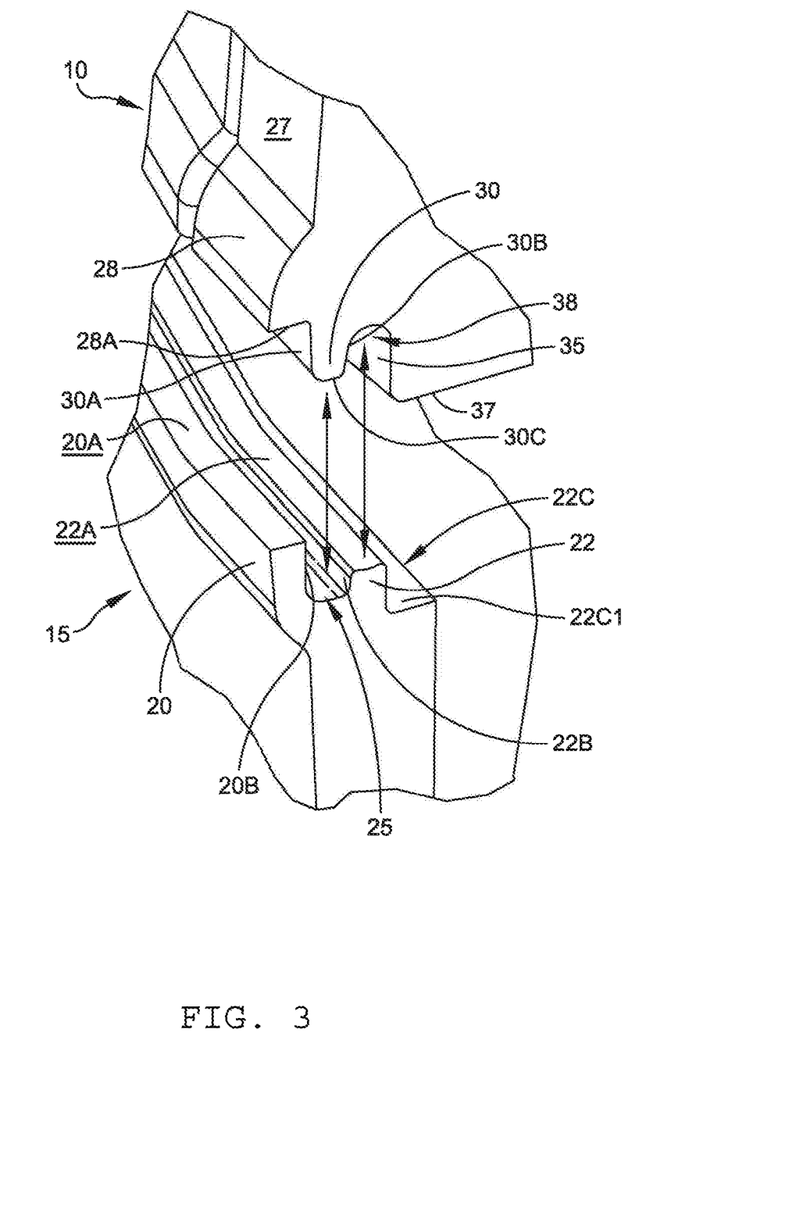
FIG. 3 is a cross sectional view of the sealing assembly of the present invention as implemented in the GFCI enclosure of FIG. 1.
Figure 4:
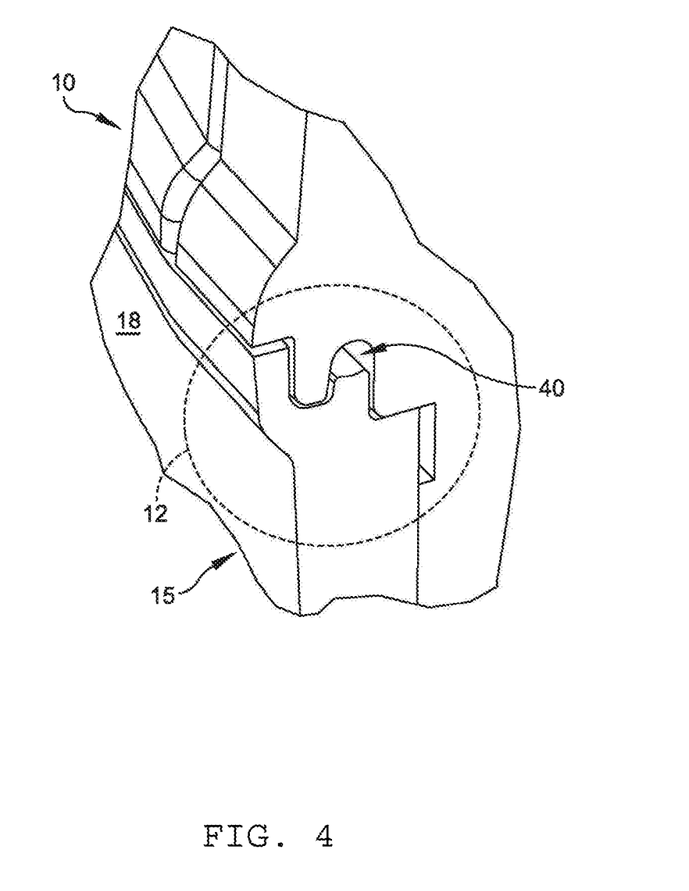
FIG. 4 is an exploded view of FIG. 3.

Referring to FIG. 3 and FIG. 4, top cover 15 includes a sidewall 18 having a first upper projecting lip 20 including a top surface 20A and interior side surface 20B. A second upper lip projection 22 formed interior to sidewall 18 includes a top surface 22A and side surfaces 22B and 22C. First upper projecting lip 20 top surface 20A extends higher than second upper lip projection 22 top surface 22A. First upper projecting lip 20 interior side surface 20B opposes second upper lip projection 22 first side surface 22B forming a channel 25 therebetween. Second side surface 22C of second upper lip projection 22 extends downward to an orthogonal base 22C1 that sits lower than the base of channel 25.

Referring to FIG. 3, dual-chamber housing 10 includes a sidewall 27 having a first downward projecting lip 28. The downward projecting lip 28 includes a dual-chamber surface 28A that projects inward from sidewall 27 to a first downward lip extension 30 to form an edge recess. Downward lip extension 30 includes opposing side surfaces 30A and 30B and a top surface 30C. The edge recess is formed by bottom surface 28A and side surface 30A. Side surface 30B is opposite a third opposing side surface 35 extending to an orthogonal extension surface 37, which forms a downward projecting lip. Side surface 30B and opposing side surface 35 form a channel 38 therein. Orthogonal extension surface 37, forming a downward projecting lip extends beyond top surface 30C, of downward lip extension 30, which extends beyond bottom surface 28A.

As illustrated in FIGS. 3 and 4, when top cover 15 and dual-chamber housing 10 are mated lip extension 20 top surface 20A is in substantial alignment with bottom surface 28A, and downward lip extension 30 is received in channel 25. Also, channel 38 receives upper lip projection 22, and orthogonal lip extension surface 37 of dual-chamber housing 10 is in substantial alignment with orthogonal base 22C1 of top cover 15. Upper lip extension 22 rests below the top surface of channel 38 to leave an opening 40 for the placement of a sealing gasket 42 therein (See FIG. 1). Top surface 22A of upper lip projection 22 may include a curved seating surface to seat sealing gasket 42. Furthermore, channel 38 may include a rounded top surface for better sealing and compression of a gasket 42 located within opening 40.

Referring to FIG. 4, the mated enclosure includes a compressible gasket 42 (See FIG. 1) in opening 40 that is sized appropriately to compress within the opening 40. The gasket 42 is utilized for the prevention of moisture and seepage within the electronics enclosure area 222.

Referring now to FIGS. 1, 2, 5, and 6, the sealing mechanism 512 in this example is for mating the top wire chamber cover 10A and dual-chamber housing 10 of the electrical enclosure for enclosing wire chamber 222A. Still referring to FIG. 2, it will be appreciated that electronics chamber 222 is vertically and horizontally opposite wire chamber 222A Referring to FIG. 5 and FIG. 6, top wire chamber cover 10A includes a sidewall 518 having a third upper projecting lip 620 including a top surface 620A and interior side surface 620B. A fourth upper lip projection 622 formed interior to sidewall 518 includes a top surface 622A and side surfaces 622B and 622C. Third upper projecting lip 620 top surface 620A extends higher than fourth upper lip projection 622 top surface 622A. Third upper projecting lip 620 interior side surface 620B opposes fourth upper lip projection 622 first side surface 622B forming a channel 625 therebetween. Second side surface 622C of fourth upper lip projection 622 extends downward to an orthogonal base 622C1 that sits lower than the base of channel 625.

Figure 6:
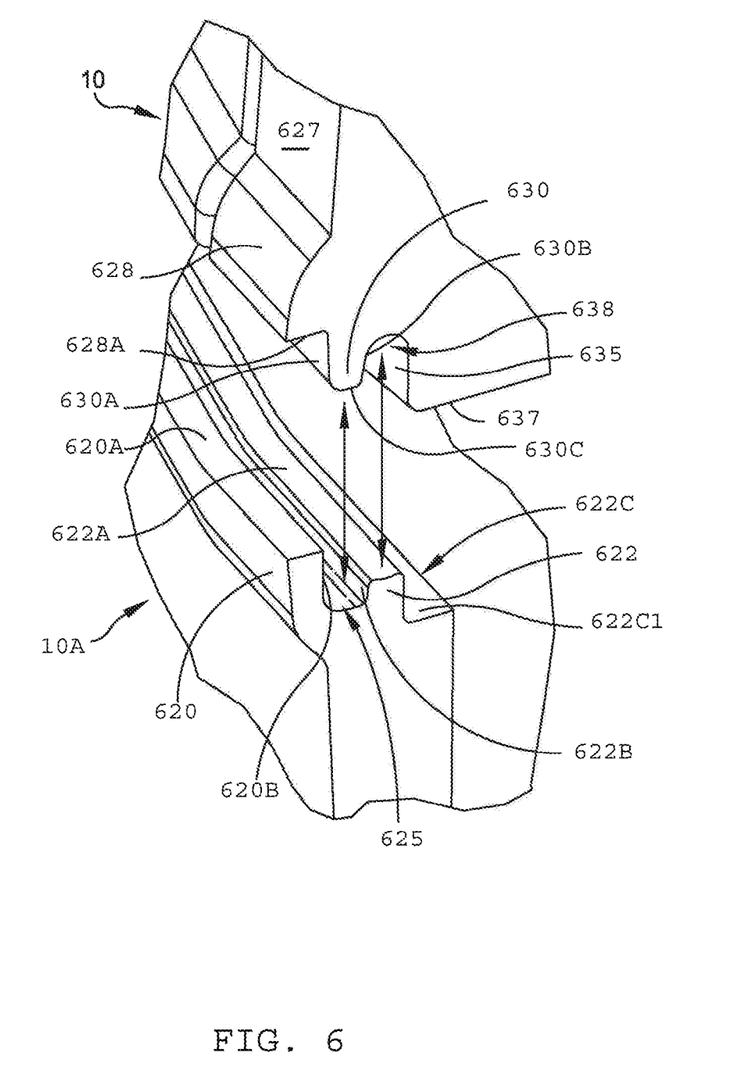
FIG. 6 is an exploded view of FIG. 5.

Referring to FIG. 6, dual-chamber housing 10 includes a sidewall 627 having a first downward projecting lip 628. The downward projecting lip 628 includes a bottom surface 628A that projects inward from sidewall 627 to a first downward lip extension 630 to form an edge recess. Downward lip extension 630 includes opposing side surfaces 630A and 630B and a top surface 630C. The edge recess is formed by bottom surface 628A and side surface 630A. Side surface 630B is opposite a third opposing side surface 635 extending to an orthogonal extension surface 637, which forms a downward projecting lip. Side surface 630B and opposing side surface 635 form a channel 638 therein. Orthogonal extension surface 637, forming a downward projecting lip extends beyond top surface 630C, of downward lip extension 630, which extends beyond bottom surface 628A.

Figure 5:
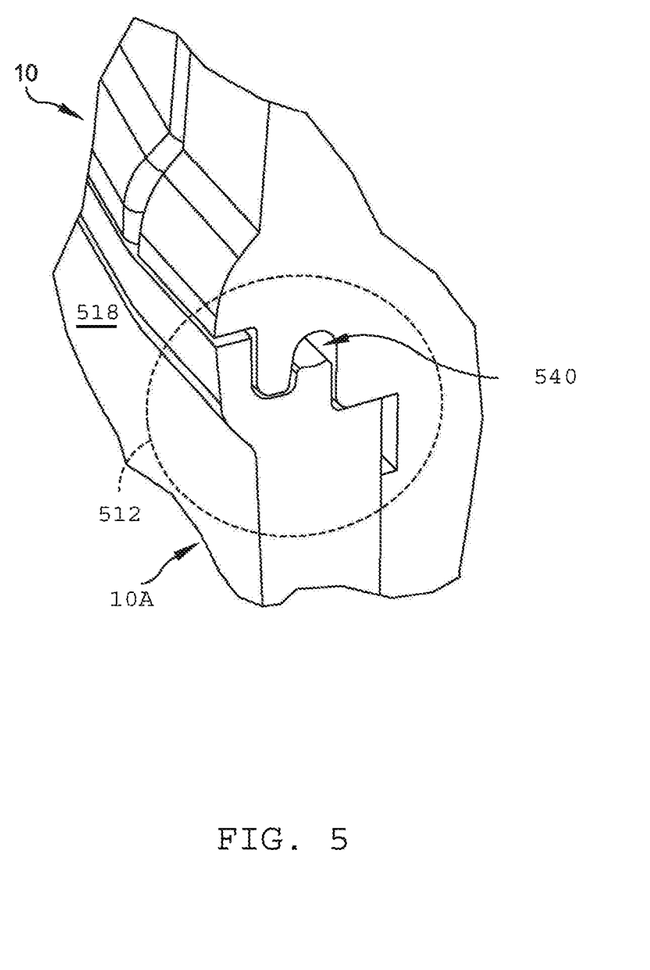
FIG. 5 is a cross sectional view of the sealing assembly of the present invention as implemented in the GFCI enclosure of FIG. 1.

As illustrated in FIGS. 5 and 6, when wire chamber cover 10A and dual-chamber housing 10 are mated lip extension 620 top surface 620A is in substantial alignment with bottom surface 628A, and downward lip extension 630 is received in channel 625. Also, channel 638 receives upper lip projection 622, and orthogonal lip extension surface 637 of dual-chamber housing 10 is in substantial alignment with orthogonal base 622C1 of wire chamber cover 10A. Upper lip extension 622 rests below the top surface of channel 638 to leave an opening 540 for the placement of a sealing gasket 832 therein (See FIG. 1). Top surface 622A of upper lip projection 622 may include a curved seating surface to seat sealing gasket 83. Furthermore, channel 638 may include a rounded top surface for better sealing and compression of a gasket 83 located within opening 540.

Referring to FIG. 5, the mated enclosure includes a compressible gasket 83 (See FIG. 1) in opening 540 that is sized appropriately to compress within the opening 540. The gasket 83 is utilized for the prevention of moisture and seepage within the wire chamber area 223.

It will be appreciated that the cooperative mating arrangement between the top wire chamber cover 10A and dual-chamber housing 10 and helps to conceal gasket 83 from physical damage and/or ultra violet (UV) radiation. By not exposing the gasket 83, UL regulations allow for more choices for gasket materials. Thus, compressible gasket 83 can be made from molded silicone or similar materials that are less degradable over time.

It should be understood that the foregoing description is only illustrative of the invention. Thus, various alternatives and modifications can be devised by those skilled in the art without departing from the invention. Accordingly, the present invention is intended to embrace all such alternatives, modifications and variances that fall within the scope of the appended claims.

We claim:

1. A dual sealing gasket assembly for mating an electrical device enclosure, the electrical device enclosure comprises:
   a dual chamber housing, wherein the dual chamber housing comprises:
      an electronics chamber;
      a wire chamber, and wherein the electronics chamber and the wire chamber are on vertically opposite sides of the dual chamber housing;
   an electronics chamber cover mateable with the dual chamber housing for enclosing the electronics chamber;
   a wire chamber cover mateable with the dual chamber housing for enclosing the wire chamber;
   a first sealing gasket assembly comprising:
      a first sealing section disposed around the circumference of the electronics chamber cover, the first sealing section including first and second upper projecting lip extensions, the second upper projecting lip extension having a height less than the first upper projecting lip extension, the first and second upper projecting lip extensions of the first sealing section forming a first channel therebetween;
      a second sealing section disposed around the circumference of the electronics chamber, the second sealing section comprising:
         a first downward projecting lip extension, the first downward projecting lip extension offset from the first upper projecting lip extension when the electronics chamber cover and the electronics chamber are joined, the first downward projecting lip extension engaged within the first channel of the first sealing section, the second sealing section further including a second channel adjacent to the first downward projecting lip extension, wherein the second upper projecting lip extension of the first sealing section is engageable within the second channel when the electronics chamber cover and the electronics chamber are joined;
   a second sealing gasket assembly comprising:
      a third sealing section disposed around the circumference of the wire chamber cover, the third sealing section including third and fourth upper projecting lip extensions, the fourth upper projecting lip extension having a height less than the third upper projecting lip extension, the third and fourth upper projecting lip extensions of the third sealing section forming a third channel therebetween;
      a fourth sealing section disposed around the circumference of the wire chamber, the fourth sealing section comprising:
         a second downward projecting lip extension, the second downward projecting lip extension offset from the third upper projecting lip extension when the wire chamber cover and the wire chamber are joined, the second downward projecting lip extension engaged within the third channel of the third sealing section, the fourth sealing section further including a fourth channel adjacent to the second downward projecting lip extension, the fourth upper projecting lip extension of the third sealing section is engageable within the fourth channel when the wire chamber cover and the wire chamber are joined;
      a stubbed gasket, wherein the gasket comprises at least one locating stub; and
      wherein the dual chamber housing comprises at least one receptacle for receiving the at least one locating stub.

2. The dual sealing gasket assembly for mating an electrical device enclosure, as in claim 1, wherein the second upper projecting lip extension of the first sealing section is partially engaged in the second sealing section channel, defining a first opening therein; and wherein the third upper projecting lip extension of the third sealing section is partially engaged in the fourth sealing section channel, defining a second opening therein.

3. The dual sealing gasket assembly for mating an electrical device enclosure, as in claim 2, wherein the first sealing section second upper projecting lip extension or the third sealing section fourth upper projecting lip extension includes first and second side surfaces and a first top surface, the second side surface extending below the first side surface to a first orthogonal edge surface, the first sealing section second upper projecting lip extension extending partially into the second sealing section channel, further defining the first or second opening, respectively.

4. The dual sealing gasket assembly for mating an electrical device enclosure, as in claim 3, wherein the second sealing section channel or fourth sealing section channel includes third and fourth side surfaces and a second top surface, the second side surface extending to a second orthogonal edge surface.

5. The dual sealing gasket assembly for mating an electrical device enclosure, as in claim 4, wherein the second orthogonal edge surface and the first orthogonal edge surface are engaged when the electronics chamber cover and the electronics chamber or the wire cover and the wire chamber are joined.

6. The dual sealing gasket assembly for mating an electrical device enclosure, as in claim 5, wherein the first opening further includes a gasket therein.

7. The dual gasket sealing assembly for mating an electrical device enclosure, as in claim 6, wherein the first sealing section second upper projecting lip top surface further includes a first curved seating surface, the gasket positioned on the seating surface.

8. The dual gasket sealing assembly for mating an electrical device enclosure, as in claim 7, wherein the gasket is sized to compress when the electronics chamber cover and the electronics chamber are joined.

9. The dual sealing gasket assembly for mating an electrical device enclosure, as in claim 5, wherein the second opening further includes the stubbed gasket therein.

10. The dual sealing gasket assembly for mating an electrical device enclosure, as in claim 9, wherein the third sealing section fourth upper projecting lip top surface further includes a second curved seating surface, the stubbed gasket positioned on the seating surface.

11. The dual sealing gasket assembly for mating an electrical device enclosure, as in claim 10, wherein the stubbed gasket is sized to compress when the wire chamber cover and the wire chamber are joined.

12. A dual sealing gasket assembly for mating an electrical device enclosure, the electrical device enclosure comprises:
   a dual chamber housing, wherein the dual chamber housing comprises:
      an electronics chamber;
      a wire chamber, and wherein the dual chamber housing isolates the electronics chamber from wire chamber;
   an electronics chamber cover mateable with the dual chamber housing for enclosing the electronics chamber;
   a wire chamber cover mateable with the dual chamber housing for enclosing the wire chamber;
   a first sealing gasket assembly comprising:
      a first sealing section disposed around the circumference of the electronics chamber cover, the first sealing section including first and second upper projecting lip extensions, the second upper projecting lip extension having a height less than the first upper projecting lip extension, the first and second upper projecting lip extensions of the first sealing section forming a first channel therebetween;
      a second sealing section disposed around the circumference of the electronics chamber, the second sealing section comprising:
         a first downward projecting lip extension, the first downward projecting lip extension offset from the first upper projecting lip extension when the electronics chamber cover and the electronics chamber are joined, the first downward projecting lip extension engaged within the first channel of the first sealing section, the second sealing section further including a second channel adjacent to the first downward projecting lip extension, wherein the second upper projecting lip extension of the first sealing section is engageable within the second channel when the electronics chamber cover and the electronics chamber are joined;
   a second sealing gasket assembly comprising:
      a third sealing section disposed around the circumference of the wire chamber cover, the third sealing section including third and fourth upper projecting lip extensions, the fourth upper projecting lip extension having a height less than the third upper projecting lip extension, the third and fourth upper projecting lip extensions of the third sealing section forming a third channel therebetween;
      a fourth sealing section disposed around the circumference of the wire chamber, the fourth sealing section comprising:
         a second downward projecting lip extension, the second downward projecting lip extension offset from the third upper projecting lip extension when the wire chamber cover and the wire chamber are joined, the second downward projecting lip extension engaged within the third channel of the third sealing section, the fourth sealing section further including a fourth channel adjacent to the second downward projecting lip extension, the fourth upper projecting lip extension of the third sealing section is engageable within the fourth channel when the wire chamber cover and the wire chamber are joined;
      a stubbed gasket, wherein the gasket comprises at least one locating stub;
   wherein the dual chamber housing comprises at least one receptacle for receiving the at least one locating stub; and
   wherein the second upper projecting lip extension of the first sealing section is partially engaged in the second sealing section channel, defining a first opening therein; and
   wherein the third upper projecting lip extension of the third sealing section is partially engaged in the fourth sealing section channel, defining a second opening therein.

13. The dual sealing gasket assembly for mating an electrical device enclosure, as in claim 12, wherein the first sealing section second upper projecting lip extension or the third sealing section fourth upper projecting lip extension includes first and second side surfaces and a first top surface, the second side surface extending below the first side surface to a first orthogonal edge surface, the first sealing section second upper projecting lip extension extending partially into the second sealing section channel, further defining the first or second opening, respectively.

14. The dual sealing gasket assembly for mating an electrical device enclosure, as in claim 13, wherein the second sealing section channel or fourth sealing section channel includes third and fourth side surfaces and a second top surface, the second side surface extending to a second orthogonal edge surface.

15. The dual sealing gasket assembly for mating an electrical device enclosure, as in claim 14, wherein the second orthogonal edge surface and the first orthogonal edge surface are engaged when the electronics chamber cover and the electronics chamber or the wire cover and the wire chamber are joined and wherein the first opening further includes a gasket therein and wherein the first sealing section second upper projecting lip top surface further includes a first curved seating surface, the gasket positioned on the seating surface, and wherein the gasket is sized to compress when the electronics chamber cover and the electronics chamber are joined.

16. The dual sealing gasket assembly for mating an electrical device enclosure, as in claim 12, wherein the second opening further includes the stubbed gasket therein and wherein the third sealing section fourth upper projecting lip top surface further includes a second curved seating surface, the stubbed gasket positioned on the second curved seating surface, and wherein the stubbed gasket is sized to compress when the wire chamber cover and the wire chamber are joined.

* * * * *